United States Patent
Alpaslan et al.

(10) Patent No.: US 7,596,125 B2
(45) Date of Patent: **\*Sep. 29, 2009**

(54) ADJUSTING THE AMPLITUDE AND PHASE CHARACTERISTICS OF TRANSMITTER GENERATED WIRELESS COMMUNICATION SIGNALS IN RESPONSE TO BASE STATION TRANSMIT POWER CONTROL SIGNALS AND KNOWN TRANSMITTER AMPLIFIER CHARACTERISTICS

(75) Inventors: Demir Alpaslan, Commack, NY (US); Leonid Kazakevich, Plainview, NY (US); Geetha Lakshmi Narayan, Holbrook, NY (US)

(73) Assignee: InterDigital Technology Corporation, Wilmington (DE)

( * ) Notice: Subject to any disclaimer, the term of this patent is extended or adjusted under 35 U.S.C. 154(b) by 917 days.

This patent is subject to a terminal disclaimer.

(21) Appl. No.: 11/100,903

(22) Filed: Apr. 7, 2005

(65) Prior Publication Data

US 2005/0170796 A1    Aug. 4, 2005

Related U.S. Application Data

(63) Continuation of application No. 10/749,025, filed on Dec. 30, 2003, now Pat. No. 6,907,025.

(60) Provisional application No. 60/476,315, filed on Jun. 6, 2003.

(51) Int. Cl.
*H04B 7/216* (2006.01)
(52) U.S. Cl. .................................... 370/342
(58) Field of Classification Search ................. 370/342, 370/335, 535; 455/522
See application file for complete search history.

(56) References Cited

U.S. PATENT DOCUMENTS

| 5,708,681 | A | 1/1998 | Malkemes et al. |
| 6,091,941 | A * | 7/2000 | Moriyama et al. ........... 455/126 |
| 6,225,928 | B1 * | 5/2001 | Green ......................... 341/143 |

(Continued)

FOREIGN PATENT DOCUMENTS

JP    11-154880    6/1999

(Continued)

OTHER PUBLICATIONS

Kusunoki et al., "Power Amplifier Module With Digital Adaptive Predistortion for Cellular Phones," IEEE Transactions on Microwave Theory and Techniques, vol. 50, No. 12, pp. 2979-2986 (Dec. 2002).

*Primary Examiner*—Derrick W Ferris
*Assistant Examiner*—Mohammad Anwar
(74) *Attorney, Agent, or Firm*—Volpe and Koenig, P.C.

(57) ABSTRACT

A method and system for adjusting the amplitude and phase characteristics of wireless communication signals generated by an analog radio transmitter, based on transmit power control (TPC) signals received by a base station (BS) and known characteristics of a power amplifier (PA) included in the transmitter. A digital pre-distortion compensation module, having real and imaginary signal paths, receives and processes real and imaginary signal components used to generate the wireless communication signal. The phase and amplitude characteristics of the wireless communication signal are controlled in response to the TPC signals, such that impaired amplitude and phase characteristics of the PA are corrected.

18 Claims, 4 Drawing Sheets

U.S. PATENT DOCUMENTS

| | | |
|---|---|---|
| 6,650,691 B2 | 11/2003 | Cramer, III |
| 6,741,867 B1 * | 5/2004 | Tetsuya ............. 455/522 |
| 6,907,025 B2 * | 6/2005 | Demir et al. ............. 370/342 |
| 2004/0166884 A1 | 8/2004 | Oh et al. |
| 2005/0070226 A1 * | 3/2005 | Rigge ............. 455/41.3 |

FOREIGN PATENT DOCUMENTS

| | | |
|---|---|---|
| JP | 2001-156868 | 6/2001 |
| WO | 95/23460 | 8/1995 |

* cited by examiner

ADJUSTING THE AMPLITUDE AND PHASE CHARACTERISTICS OF TRANSMITTER GENERATED WIRELESS COMMUNICATION SIGNALS IN RESPONSE TO BASE STATION TRANSMIT POWER CONTROL SIGNALS AND KNOWN TRANSMITTER AMPLIFIER CHARACTERISTICS

CROSS REFERENCE TO RELATED APPLICATION

This application is a continuation of U.S. patent application Ser. No. 10/749,025 filed Dec. 30, 2003, which claims the benefit of U.S. Provisional Patent Application Ser. No. 60/476,315 filed Jun. 6, 2003, which are incorporated by reference as if fully set forth herein.

FIELD OF THE INVENTION

The present invention generally relates to transmitter design in wireless communication systems. More particularly, the present invention relates to digital signal processing (DSP) techniques used to compensate for carrier leakage introduced in an analog radio transmitter.

BACKGROUND

Existing wireless system architectural configurations impose stringent constraints on the system designer with regards to transmitting communication signals. Moreover, such configurations often provide low reliability communication links, high operating costs, and an undesirably low level of integration with other system components.

In the radio frequency (RF) section of a conventional low-cost wireless transmitter configured with analog components, a considerable level of distortion occurs when RF signals are processed. Higher cost components with better distortion characteristics that enhance signal quality may be overlooked during the design phase in order to reduce the cost of the end-product.

For example, a common problem associated with conventional wireless communication systems is that the characteristics of a power amplifier (PA) which outputs amplified communication signals from an analog radio transmitter, may not have linear characteristics throughout its operating range, and/or may cause the phase of the communication signals to change.

Because the costs of components that process RF analog signals are higher than the components that use DSP, it is desired to provide a digital baseband (DBB) system, including a low cost transmitter with low noise and minimal power requirements, that utilizes DSP techniques to provide compensation for amplitude and phase impairments caused by the PA of an analog radio transmitter.

SUMMARY

The present invention is method and system for adjusting the amplitude and phase characteristics of wireless communication signals generated by an analog radio transmitter, based on transmit power control (TPC) signals received by a base station (BS) and known characteristics of a PA included in the transmitter. A digital pre-distortion compensation module, having real and imaginary signal paths, receives and processes real and imaginary signal components used to generate the wireless communication signal. The phase and amplitude characteristics of the wireless communication signal are controlled in response to the TPC signals, such that impaired amplitude and phase characteristics of the PA are corrected.

The present invention may be incorporated into a DBB transmitter, a wireless transmit/receive unit (WTRU), an integrated circuit (IC), a wireless communication system and method, or any other desired communication mechanism. In a preferred embodiment, a DBB transmitter sends at least one wireless communication signal to a BS which is configured to generate a TPC signal in response to receiving the wireless communication signal. The BS has stored therein one or more established criteria associated with at least one expected characteristic of the wireless communication signal.

The present invention includes a digital pre-distortion compensation module, an analog radio transmitter and a controller. The digital pre-distortion compensation module has real and imaginary signal paths which are configured to receive and process real and imaginary signal components used to generate the wireless communication signal.

The analog radio transmitter includes a PA. The analog radio transmitter is configured to receive the processed real and imaginary signal components and, in response, generate a communication signal which is input to the PA. The PA is configured to amplify the generated communication signal, such that the amplified communication signal is emitted from the present invention as the wireless communication signal.

The controller is in communication with the digital pre-distortion compensation module and the PA. The controller is configured to control the characteristics of the wireless communication signal based on the TPC signal generated by the BS.

The present invention may further include a modem having real and imaginary signal paths. The modem may be configured to generate the real and imaginary signal components, receive the TPC signal and pass the TPC signal to the controller.

The present invention may further include a first low pass filter (LPF) which couples the real signal path of the modem to the real signal path of the digital pre-distortion compensation module, and a second LPF which couples the imaginary signal path of the modem to the imaginary signal path of the digital pre-distortion compensation module.

The controller may include a TPC mapping unit which receives the TPC signal from the modem and outputs a first mapped TPC signal to the digital pre-distortion compensation module and a second mapped TPC signal to the PA.

The digital pre-distortion compensation module may include a power estimation unit, a first multiplier, at least one look up table (LUT) and a phase distortion compensation unit. The power estimation unit may be coupled to each of the real and imaginary signal paths. The power estimation unit may be configured to generate a power estimation signal based on the magnitude of the real and imaginary signal components. The first multiplier may be configured to multiply the power estimation signal with the first mapped TPC signal to generate a first resulting product signal. The selected LUT may be configured to generate an amplitude compensation value in response to receiving the first resulting product signal. The phase distortion compensation unit may be configured to generate a phase compensation signal in response to receiving the first product signal.

The amplitude compensation signal may be used by the digital pre-distortion compensation module to correct at least one impaired amplitude characteristic associated with the PA. The phase compensation signal may be used by the digital pre-distortion compensation module to correct at least one impaired phase characteristic associated with the PA. The second mapped TPC signal may be used to adjust the gain of the PA such that the PA does not operate in a nonlinear fashion.

BRIEF DESCRIPTION OF THE DRAWINGS

A more detailed understanding of the invention may be had from the following description of a preferred example, given by way of example and to be understood in conjunction with the accompanying drawing wherein.

DETAILED DESCRIPTION OF THE PREFERRED EMBODIMENTS

Figure 1:
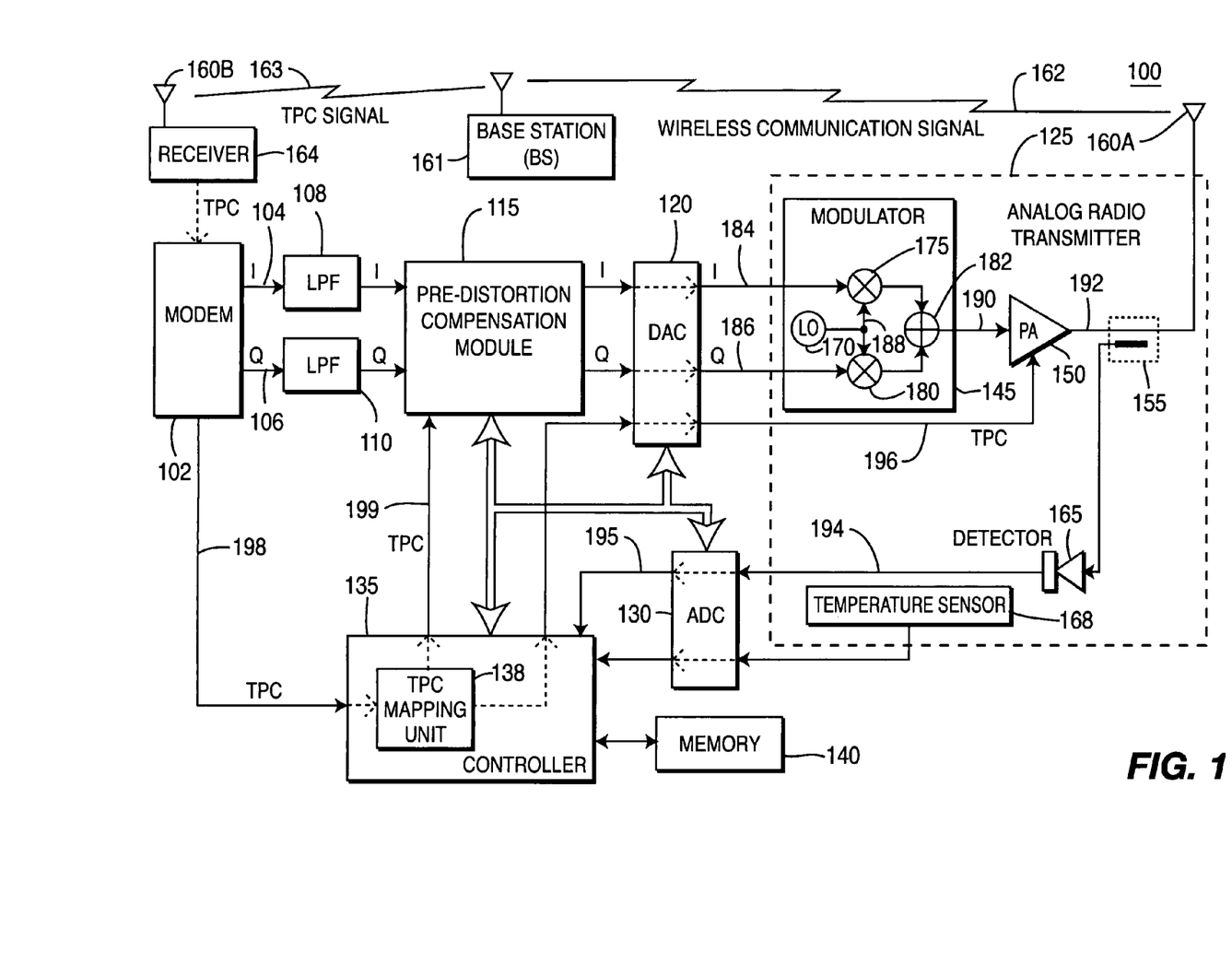
FIG. 1 is a block diagram of a DBB RF transmitter with a digital pre-distortion compensation module configured in accordance with a preferred embodiment of the present invention.

FIG. 1 is a block diagram of a DBB RF transmitter 100, configured in accordance with a preferred embodiment of the present invention. Although the invention will be referred to in terms of being implemented upon a transmitter 100, it should also be understood by those of skill in the art that the invention pertains equally to a transceiver.

Preferably, the method and system disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the present invention may be incorporated into an integrated circuit (IC) or be configured in a circuit comprising a multitude of interconnecting components.

The present invention is applicable to communication systems using time division duplex (TDD), time division multiple access (TDMA), frequency division duplex (FDD), code division multiple access (CDMA), CDMA 2000, time division synchronous CDMA (TDSCDMA), and orthogonal frequency division multiplexing (OFDM). However, the present invention is envisaged to be applicable to other types of communication systems as well.

As shown in FIG. 1, the DBB RF transmitter 100 includes a modem 102 which outputs an in-phase (I) signal component 104 and a quadrature (Q) signal component 106, first and second low pass filters (LPFs) 108, 110, a digital pre-distortion compensation module 115, a least one digital to analog converter (DAC) 120, an analog radio transmitter 125, at least one analog to digital converter (ADC) 130, a controller 135 and a read-write memory 140.

The analog radio transmitter 125 includes a modulator 145, a PA 150, a coupling unit (e.g., a directional coupler or sample transmission line) 155, an antenna 160A, a detector 165 and a temperature sensor 168. The controller 135 includes a transmit power control (TPC) mapping unit 138. The modulator 145 of the analog radio transmitter 125 includes an LO 170, first and second modulators 175, 180, and an adder 182.

In the DBB RF transmitter 100 of FIG. 1, the modem 102 outputs the I and Q signal components 104, 106, to the analog radio transmitter via the LPFs 108, 110, the digital pre-distortion compensation module 115, and the DAC 120. Based on the I and Q signal components 104, 106, the DAC 120 outputs an analog real signal 184 to the first modulator 175, and an analog imaginary signal 186 to the second modulator 180. The LO 170 of the modulator 145 provides an LO input signal 188 to each of the first and second modulators 175, 180. The outputs of the first and second modulators 175, 180 are summed together by the adder 182 to generate an analog complex modulated signal 190 which is input to the PA 150. In response to receiving the analog complex modulated signal 190, the PA 150 outputs an amplified communication signal 192, which is emitted from antenna 160A of the analog radio transmitter 125 as a wireless communication signal 162. The amplified communication signal 192 is monitored by the detector 165 via the coupling unit 155. The detector 165 generates a feedback signal 194 which provides a detected reading having a magnitude that is a function of the amplified communication signal 192.

The ADC 130 receives the feedback signal 194 and outputs a digital signal 195 to the controller 135. The controller 135 controls the operation of the DAC 120 and the ADC 130 based on various values stored in the memory 140.

The power level of the I and Q signal components output by the modem 102 is constant. When a BS 161 receives a wireless communication signal 162 transmitted from the antenna 160A of the DBB RF transmitter 100, the BS 161 compares the power of the wireless communication signal 162 to a threshold or range established within the BS 161 in accordance with a predetermined criteria. If the power of the wireless communication signal 162 does not meet the predetermined criteria, the BS 161 sends a wireless TPC signal 163 to a receiver 164 having an antenna 160B which receives the wireless TPC signal 163, and forwards a converted version (e.g., analog or digital) of the wireless TPC signal 163 to the modem 102 of the DBB RF transmitter 100. The receiver 164 and the DBB RF transmitter 100 may operate together (i.e., as a transceiver) in a single WTRU, whereby antennas 160A and 160B may be combined to form a single antenna. The TPC signal received by the modem 102 indicates how the characteristics (e.g., the power level) of the wireless communication signal 162 should be adjusted to meet the criteria.

The modem 102 provides a TPC signal 198 to the TPC mapping unit 138 of the controller 135. The TPC signal 198 is used to compensate for impairments incurred due to the existence of nonlinear operating characteristics of the PA 150. In response to receiving the TPC signal 198 (e.g., a signal measured in decibels (dBs)), the TPC mapping unit 138 may apply a first TPC mapped signal 199 to the digital pre-distortion compensation module 115 and/or, via the DAC 120, apply a second TPC mapped signal 196 to the PA 150 to control the amplitude of the amplified communication signal 192 by adjusting the gain of the PA 150. The TPC mapping unit 138 may include a plurality of LUTs, whereby one of the LUTs is selected based on the characteristics of the TPC signal 198 to generate the TPC mapped signals 196 and 199. For example, a power level measured in dB which is indicated by TPC signal 198 may be converted to a desired voltage based on information in the selected LUT of the TPC mapping unit 138, prior to outputting the TPC mapped signal 196 at a level corresponding to the desired voltage.

Figure 2:
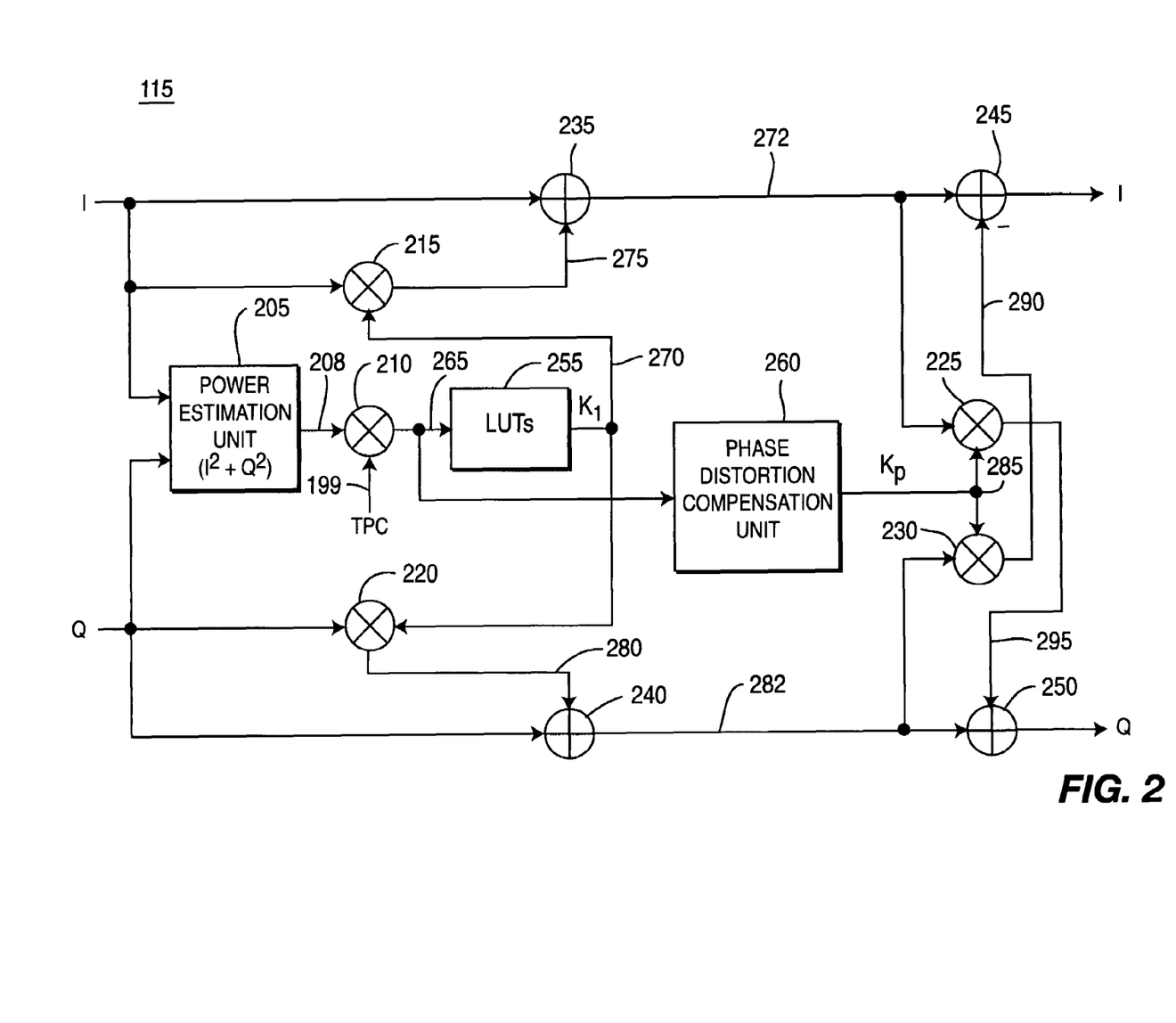
FIG. 2 shows an exemplary configuration of the digital pre-distortion compensation module in the DBB RF transmitter of FIG. 1.

FIG. 2 shows an exemplary configuration of the digital pre-distortion compensation module 115 including a power estimation unit 205, multipliers 210,215, 220, 225, 230, adders 235, 240, 245, 250, a plurality of LUTs 255 and a phase distortion compensation unit 260. The digital pre-distortion compensation module 115 performs functions on the magnitude and power of the I and Q signal components, whereby the input and output ports of the digital pre-distortion compensation unit 115 have a linear (i.e., one-to-one) correspondence.

In the analog radio transmitter 125, the PA 150 outputs the amplified communication signal 192 to the antenna 160A. The PA 150 has two RF characteristics having deficiencies which are compensated for by the digital pre-distortion compensation module 115.

The first of the RF characteristics of the PA 150 is associated with amplitude distortion, whereby the linearity of the PA 150 from input to output may be deficient. If the PA 150 is perfectly linear, the amplitude characteristics of the amplified communication signal 192 output from the PA 150 will directly correspond to the amplitude characteristics of the analog complex modulated signal 190 applied to an input of the PA 150. If the amplitude of the analog complex modulated signal 190 is continually increased, the amplified communication signal 192 at an output of the PA 150 will eventually begin to compress (i.e., the PA 150 reaches a saturation point), and thus the PA 150 will no longer acts in a linear fashion which may distort one or more amplitude characteristics of the analog radio transmitter 125, such as its dynamic range.

The second of the RF characteristics is associated with phase distortion, whereby the phase offset of the analog complex modulated signal 190 at the input of the PA 150 changes when it is amplified and output by the PA 150. This causes the amplified communication signal 192 to have an undesired constellation rotation, whereby each point on the constellation is rotated in the same direction.

In a perfectly linear PA 150, the amplitude characteristics of the output from the PA 150 will directly correspond to the amplitude characteristics of the analog complex modulated signal 190. In a realistic scenario, if the amplitude of the analog complex modulated signal 190 is continually increased, eventually the amplified communication signal 192 will begin to compress (e.g., the PA 150 reaches saturation), and thus the PA 150 no longer performs in a linear fashion.

Referring to FIG. 2, the I and Q signal components are received at power estimation unit 205 which performs a power estimate function, (e.g., $I^2+Q^2$). The power estimation unit 205 ($I^2+Q^2$) outputs a power estimation signal 208 which is multiplied with the TPC mapped signal 199 via the multiplier 210, and the resulting product signal 265 is input into a selected one of the LUTs 255 based on a temperature reading performed by the temperature sensor 168. The selected LUT 255 has stored therein amplitude characteristics of the PA 150 associated with a particular temperature range within which the temperature reading falls. The selected LUT 255 then outputs an amplitude compensation signal 270 having a value $K_1$, based on the resulting product signal 265 and the known amplitude characteristics of the PA 150, as defined by the selected LUT 255. Thus, amplitude compensation is provided to eliminate deficiencies in the analog radio transmitter 125 (i.e., due to the PA 150).

The TPC mapped signal 199 controls the output power of the analog radio transmitter 125, as designated by the resulting product signal 265. The amplitude compensation signal 270 is multiplied with the I and Q signal components, respectively, via the multipliers 215 and 220, and the resulting product signals 275, 280, are added to the I and Q signal components via adders 235 and 240, respectively.

Note that the sole purpose of the adders 235, 240, is to avoid the unintentional deactivation of the I and Q signal components should the value of $K_1$ be zero.

Referring still to FIG. 2, the resulting product signal 265 is also input to the phase distortion compensation unit 260 which, in turn, outputs a phase compensation signal 285 having a value $K_p$ to provide phase rotation.

The phase compensation signal 285 is multiplied with the I and Q signal components, respectively, via the multipliers 225 and 230. The resulting product signal 290 output by the multiplier 230 is subtracted from the real signal component via adder 245. The resulting product signal 295 output by the multiplier 225 is added to the imaginary signal component via adder 250.

Based on the phase compensation signal 285, the digital pre-distortion compensation module 115 rotates the constellation such that the real and imaginary characteristics of the signal components are the same in all four quadrants of the constellation, thus forming a perfect square in the constellation.

The digital pre-distortion compensation module 115 receives a real (Re) I signal component and an imaginary (jIm) Q signal component and rotates the phase of the signal components Re and jIm by $K_p$ degrees as described by Equation 1 below:

$$(Re+jIm) \times e^{jK_p} \qquad \text{Equation (1)}$$

The outcome of the real output, $\hat{R}e$, is described by Equation 2 below:

$$\hat{R}e = Re - (K_p \times Im) \qquad \text{Equation (2)}$$

The output of the imaginary output, $\hat{I}m$, is described by Equation 3 below:

$$\hat{I}m = Im + (K_p \times Re) \qquad \text{Equation (3)}$$

Figure 3A:
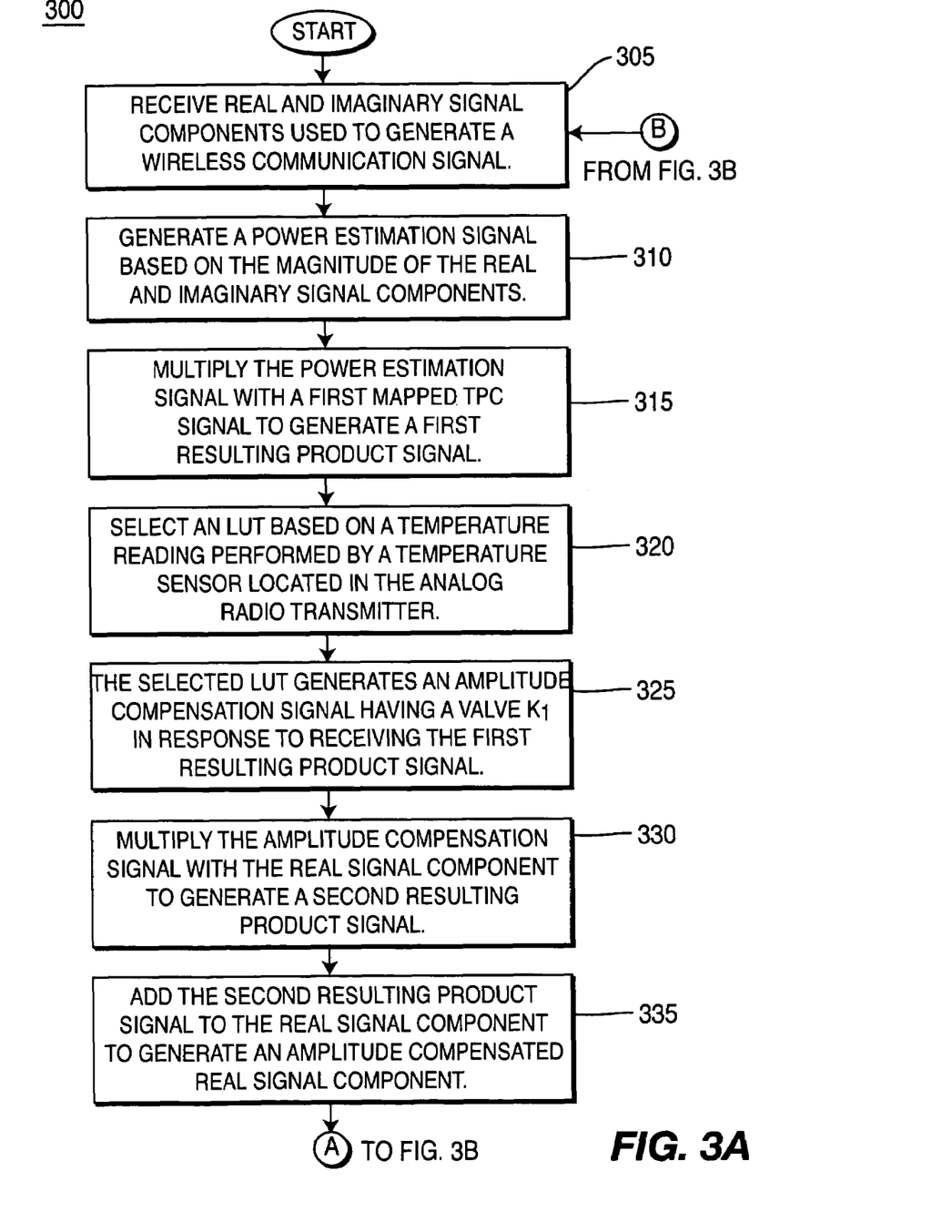
FIGS. 3A and 3B, taken together, are a flow chart of a process including method steps used to adjust signals output by the DBB RF transmitter of FIG. 1.
Figure 3B:
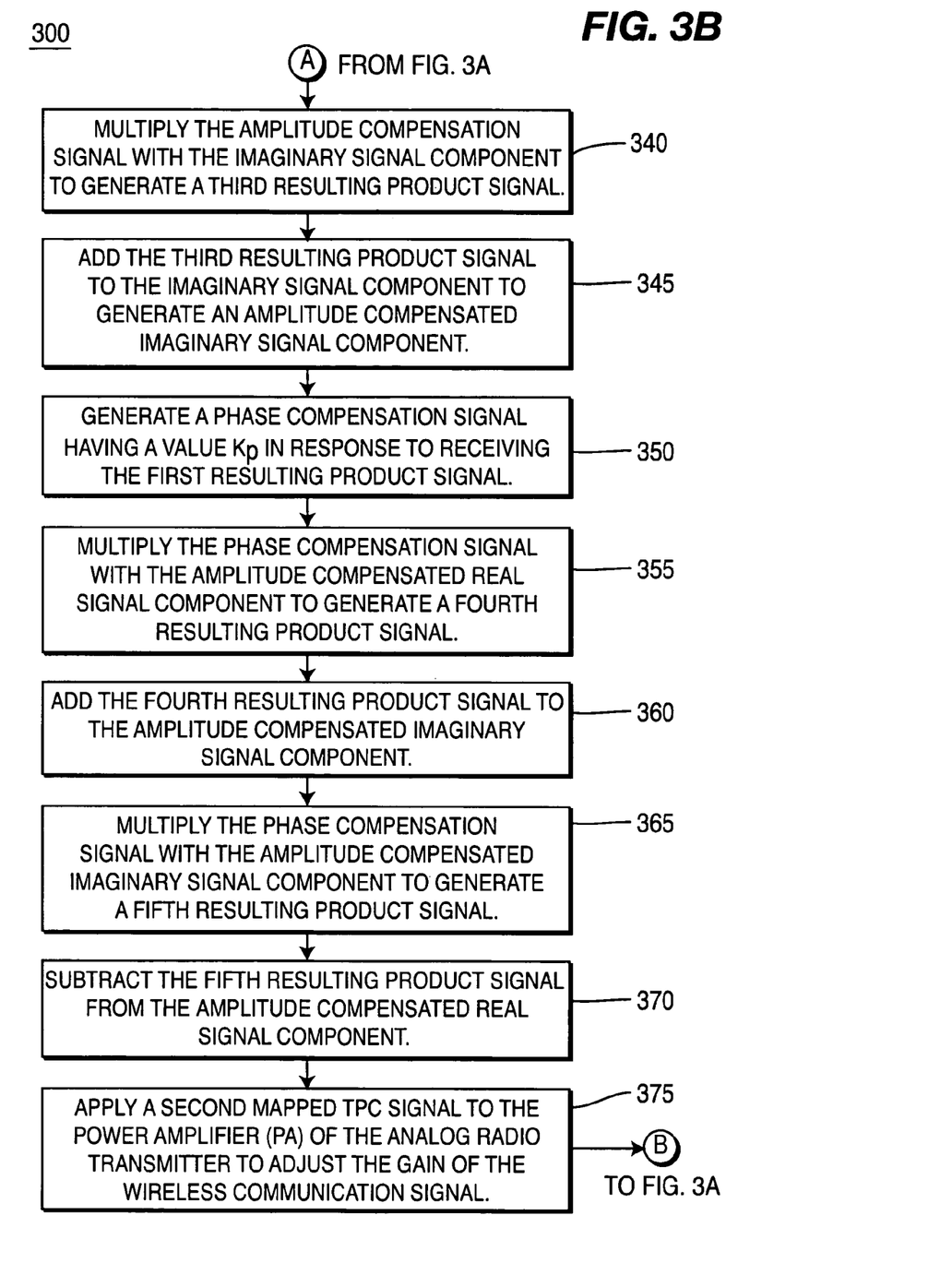

FIGS. 3A and 3B, taken together, are a flow chart of an exemplary process 300 which includes method steps used to adjust signals output by the DBB RF transmitter 100. The process 300 is implemented in a wireless communication system including a BS 161, as shown in FIG. 1. The BS 161 is configured to generate a transmit power control (TPC) signal 163 in response to receiving a wireless communication signal 162 from an analog radio transmitter 125 of the DBB RF transmitter 100. The BS 161 has stored therein one or more established criteria associated with at least one expected characteristic of the wireless communication signal 162. When an expected characteristic such as the power of the wireless communication signal 162 does not meet the criteria of the BS 161, the BS 161 generates the TPC signal 163 such that the DBB RF transmitter will adjust the amplitude and/or phase characteristics of the wireless communication signal 162.

Referring to FIGS. 1-3B, the process 300 is implemented to adjust the amplitude and phase characteristics of the wireless communication signal 162. In step 305, real and imaginary signal components which are used to generate the wireless communication signal 162, are received by the power estimation unit 205 of the pre-distortion compensation module 115. In step 310, the power estimation unit 205 generates a power estimation signal 208 based on the magnitude of the real and imaginary signal components (e.g., the function $I^2+Q^2$ is performed). In step 315, the power estimation signal 208 is multiplied with a first mapped TPC signal 199, via the multiplier 210, to generate a first resulting product signal 265. The first mapped TPC signal 199 is derived from the TPC signal 163 generated by the BS 161.

In step 320, at least one of a plurality of LUTs 255 is selected in response to a temperature reading performed by a temperature sensor 168 located in the analog radio transmitter 125.

In step 325, an amplitude compensation signal 270 having a value $K_1$ is generated by the selected LUT 255 in response to receiving the first resulting product signal 265. In step 330, the amplitude compensation signal 270 is multiplied with the real signal component, via multiplier 215, to generate a second resulting product signal 275. In step 335, the second resulting product signal 275 is added to the real signal component, via adder 235, to generate an amplitude compensated real signal component 272. In step 340, the amplitude compensation signal 270 is multiplied with the imaginary signal component, via multiplier 220, to generate a third resulting product signal 280. In step 345, the third resulting product signal 280 is added to the imaginary signal component, via adder 240, to generate an amplitude compensated imaginary signal component 282.

In step 350, a phase compensation signal 285 having a value $K_p$ is generated by the phase distortion compensation unit 260 in response to receiving the first resulting product signal 265. In step 355, the phase compensation signal 285 is multiplied with the amplitude compensated real signal component 272, via multiplier 225, to generate a fourth resulting product signal 295. In step 360, the fourth resulting product signal 295 is added to the amplitude compensated imaginary signal component 282, via adder 250. In step 365, the phase compensation signal 285 is multiplied with the amplitude compensated imaginary signal component 282, via multiplier 230, to generate a fifth resulting product signal 290. In step 370, the fifth resulting product signal 290 is subtracted from the amplitude compensated real signal component 272, via adder 245.

In step 375, a second mapped TPC signal 196 is applied to the PA 150 located within the analog radio transmitter 125 to adjust the gain of the PA 150 such that it does not operate in a nonlinear fashion. The second mapped TPC signal 196 is derived from the TPC signal 163 generated by the BS 161.

The process 300 runs continuously by returning to step 305 each time the process 300 is completed. It should be understood that the process 300 is merely an example, and the order of the steps 305-375 of the process 300 may be reconfigured as desired. For example, it may be preferred to implement step 375 prior to implementing steps 310-370.

Furthermore, it should be understood that process 300 may be implemented on a sample-by-sample basis, whereby steps 305-375 are cycled through at a sample rate substantially higher than the chip rate (e.g., ten times the chip rate). Values assigned to the first and second mapped TPC signals 196, 199, do not necessarily change each time the process 300 is implemented. For example, in a TDD or other slot-based communication system, the value of the TPC signal 198 may only be updated on a frame-by-frame basis, depending upon the rate of updates of the value of TPC signal 163 that are provided by the BS 161. Thus, the mapping process implemented in the TPC mapping unit 138 of the controller 135 will follow suit by updating the values of the TPC mapping signals 196, 199, in a similar fashion.

The PA 150 outputs an amplified communication signal 192 associated with the wireless communication signal 162. The amplitude compensation value $K_1$ is used to correct distorted input amplitude to output amplitude characteristics of the PA. The phase compensation value is used to correct distorted input amplitude to output phase characteristics of the PA.

While this invention has been particularly shown and described with reference to preferred embodiments, it will be understood by those skilled in the art that various changes in form and details may be made therein without departing from the scope of the invention described hereinabove.

What is claimed is:

1. A digital baseband (DBB) transmitter comprising:
a digital pre-distortion compensation module having real and imaginary signal paths which are configured to receive and process respective real and imaginary signal components;
an analog radio transmitter including a power amplifier (PA), the analog radio transmitter being configured to receive the processed real and imaginary signal components and, in response, generating a communication signal which is input to the PA;
a modem having real and imaginary signal paths and being configured to generate the real and imaginary signal components, receive a transmit power control (TPC) signal; and
a controller in communication with the digital pre-distortion compensation module and the PA, wherein the controller includes a TPC mapping unit which receives the TPC signal from the modem, the TPC mapping unit being configured to output a first mapped TPC signal to the digital pre-distortion compensation module and a second mapped TPC signal to the PA, wherein the digital pre-distortion compensation module further comprises:
a power estimation unit coupled to each of the real and imaginary signal paths, the power estimation unit being configured to generate a power estimation signal based on the magnitude of the real and imaginary signal components;
a first multiplier being configured to multiply the power estimation signal with the first mapped TPC signal to generate a first resulting product signal;
at least one look up table (LUT) being configured to generate an amplitude compensation signal in response to receiving the first resulting product signal; and
a phase distortion compensation unit being configured to generate a chase compensation signal in response to receiving the first resulting product signal.

2. The DBB transmitter of claim 1 wherein the digital pre-distortion compensation module further comprises:
a second multiplier being configured to multiply the amplitude compensation signal with the real signal component to generate a second resulting product signal;
a first adder being configured to add the second resulting product signal to the real signal component to generate an amplitude compensated real signal component;
a third multiplier being configured to multiply the amplitude compensation signal with the imaginary signal component to generate a third resulting product signal; and
a second adder being configured to add the third resulting product signal to the imaginary signal component to generate an amplitude compensated imaginary signal component.

3. The DBB transmitter of claim 2 wherein the digital pre-distortion compensation module further comprises:
a fourth multiplier being configured to multiply the phase compensation signal with the amplitude compensated real signal component to generate a fourth resulting product signal;
a third adder being configured to add the fourth resulting product signal to the amplitude compensated imaginary signal component;
a fifth multiplier being configured to multiply the phase compensation signal with the amplitude compensated imaginary signal component to generate a fifth resulting product signal; and a fourth adder being configured to subtract the fifth resulting product signal from the amplitude compensated real signal component.

4. The DBB transmitter of claim 1 wherein the amplitude compensation signal is used by the digital pre-distortion compensation module to correct at least one impaired amplitude characteristic associated with the PA.

5. The DBB transmitter of claim 1 wherein the phase compensation signal is used by the digital pre-distortion compensation module to correct at least one impaired phase characteristic associated with the PA.

6. The DBB transmitter of claim 1 wherein the second mapped TPC signal is used to adjust the gain of the PA such that the PA does not operate in a nonlinear fashion.

7. A wireless transmit/receive unit (WTRU) comprising:
a digital pre-distortion compensation module having real and imaginary signal paths which are configured to receive and process respective real and imaginary signal components;
an analog radio transmitter including a power amplifier (PA), the analog radio transmitter being configured to receive the processed real and imaginary signal components and, in response, generating a communication signal which is input to the PA;
a modem having real and imaginary signal paths and being configured to generate the real and imaginary signal components, receive a transmit power control (TPC) signal; and
a controller in communication with the digital pre-distortion compensation module and the PA, wherein the controller includes a TPC mapping unit which receives the TPC signal from the modem, the TPC mapping unit being configured to output a first mapped TPC signal to the digital pre-distortion compensation module and a second mapped TPC signal to the PA, wherein the digital pre-distortion compensation module further comprises:
a power estimation unit coupled to each of the real and imaginary signal paths, the power estimation unit being configured to generate a power estimation signal based on the magnitude of the real and imaginary signal components;
a first multiplier being configured to multiply the power estimation signal with the first mapped TPC signal to generate a first resulting product signal;
at least one lookup table (LUT) being configured to generate an amplitude compensation signal in response to receiving the first resulting product signal; and
a phase distortion compensation unit being configured to generate a phase compensation signal in response to receiving the first resulting product signal.

8. The WTRU of claim 7 wherein the digital pre-distortion compensation module further comprises:
a second multiplier being configured to multiply the amplitude compensation signal with the real signal component to generate a second resulting product signal;
a first adder being configured to add the second resulting product signal to the real signal component to generate an amplitude compensated real signal component;
a third multiplier being configured to multiply the amplitude compensation signal with the imaginary signal component to generate a third resulting product signal; and
a second adder being configured to add the third resulting product signal to the imaginary signal component to generate an amplitude compensated imaginary signal component.

9. The WTRU of claim 8 wherein the digital pre-distortion compensation module further comprises:
a fourth multiplier being configured to multiply the phase compensation signal with the amplitude compensated real signal component to generate a fourth resulting product signal;
a third adder being configured to add the fourth resulting product signal to the amplitude compensated imaginary signal component;
a fifth multiplier being configured to multiply the phase compensation signal with the amplitude compensated imaginary signal component to generate a fifth resulting product signal; and
a fourth adder being configured to subtract the fifth resulting product signal from the amplitude compensated real signal component.

10. The WTRU of claim 7 wherein the amplitude compensation signal is used by the digital pre-distortion compensation module to correct at least one impaired amplitude characteristic associated with the PA.

11. The WTRU of claim 7 wherein the phase compensation signal is used by the digital pre-distortion compensation module to correct at least one impaired phase characteristic associated with the PA.

12. The WTRU of claim 7 wherein the second mapped TPC signal is used to adjust the gain of the PA such that the PA does not operate in a nonlinear fashion.

13. An integrated circuit (IC) comprising:
a digital pre-distortion compensation module having real and imaginary signal paths which are configured to receive and process respective real and imaginary signal components;
an analog radio transmitter including a power amplifier (PA), the analog radio transmitter being configured to receive the processed real and imaginary signal components and, in response, generating a communication signal which is input to the PA;
a modem having real and imaginary signal paths and being configured to generate the real and imaginary signal components, receive a transmit power control (TPC) signal; and
a controller in communication with the digital pre-distortion compensation module and the PA wherein the controller includes a TPC mapping unit which receives the TPC signal from the modem, the TPC mapping unit being configured to output a first mapped TPC signal to the digital pre-distortion compensation module and a second mapped TPC signal to the PA, wherein the digital pre-distortion compensation module further comprises:
a power estimation unit coupled to each of the real and imaginary signal paths, the power estimation unit being configured to generate a power estimation signal; based on the magnitude of the real and imaginary signal components;
a first multiplier being confined to multiply the power estimation signal with the first mapped TPC signal to generate a first resulting product signal;
at least one look up table (LUT) being configured to generate an amplitude compensation signal in response to receiving the first resulting product signal; and
a phase distortion compensation unit being configured to generate a phase compensation signal in response to receiving the first resulting product signal.

14. The IC of claim 13 wherein the digital pre-distortion compensation module further comprises:

a second multiplier being configured to multiply the amplitude compensation signal with the real signal component to generate a second resulting product signal;

a first adder being configured to add the second resulting product signal to the real signal component to generate an amplitude compensated real signal component;

a third multiplier being configured to multiply the amplitude compensation signal with the imaginary signal component to generate a third resulting product signal; and a second adder being configured to add the third resulting product signal to the imaginary signal component to generate an amplitude compensated imaginary signal component.

15. The IC of claim 14 wherein the digital pre-distortion compensation module further comprises:

a fourth multiplier being configured to multiply the phase compensation signal with the amplitude compensated real signal component to generate a fourth resulting product signal;

a third adder being configured to add the fourth resulting product signal to the amplitude compensated imaginary signal component;

a fifth multiplier being configured to multiply the phase compensation signal with the amplitude compensated imaginary signal component to generate a fifth resulting product signal; and a fourth adder being configured to subtract the fifth resulting product signal from the amplitude compensated real signal component.

16. The IC of claim 13 wherein the amplitude compensation signal is used by the digital pre-distortion compensation module to correct at least one impaired amplitude characteristic associated with the PA.

17. The IC of claim 13 wherein the phase compensation signal is used by the digital pre-distortion compensation module to correct at least one impaired phase characteristic associated with the PA.

18. The IC of claim 13 wherein the second mapped TPC signal is used to adjust the gain of the PA such that the PA does not operate in a nonlinear fashion.

\* \* \* \* \*

UNITED STATES PATENT AND TRADEMARK OFFICE
CERTIFICATE OF CORRECTION

PATENT NO. : 7,596,125 B2
APPLICATION NO. : 11/100903
DATED : September 29, 2009
INVENTOR(S) : Alpaslan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1196 days.

Signed and Sealed this

Twenty-eighth Day of September, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,596,125 B2 | Page 1 of 1 |
| APPLICATION NO. | : 11/100903 | |
| DATED | : September 29, 2009 | |
| INVENTOR(S) | : Demir et al. | |

It is certified that error appears in the above-identified patent and that said Letters Patent is hereby corrected as shown below:

ON THE TITLE PAGE

At Item (12), Title, page 1, left column, delete line 2, and insert therefor --Demir et al.--.

At Item (75), Inventors, page 1, left column, line 1, before the word "Commack,", delete "Demir Alpaslan" and insert therefor --Alpaslan Demir--.

IN THE CLAIMS

At claim 1, column 8, line 36, before the word "compensation" delete "chase" and insert therefor --phase--.

At claim 13, column 10, line 56, before the words "to multiply" delete "confined" and insert therefor --configured--.

Signed and Sealed this
Fifth Day of April, 2011

David J. Kappos
*Director of the United States Patent and Trademark Office*